US009644286B2

United States Patent
Hara

(10) Patent No.: US 9,644,286 B2
(45) Date of Patent: May 9, 2017

(54) SILICON CARBIDE SINGLE CRYSTAL MANUFACTURING APPARATUS

(75) Inventor: Kazukuni Hara, Kasugai (JP)

(73) Assignee: DENSO CORPORATION, Kariya (JP)

( * ) Notice: Subject to any disclaimer, the term of this patent is extended or adjusted under 35 U.S.C. 154(b) by 623 days.

(21) Appl. No.: 14/126,520

(22) PCT Filed: Jul. 24, 2012

(86) PCT No.: PCT/JP2012/004699
§ 371 (c)(1),
(2), (4) Date: Dec. 16, 2013

(87) PCT Pub. No.: WO2013/014920
PCT Pub. Date: Jan. 31, 2013

(65) Prior Publication Data
US 2014/0123901 A1  May 8, 2014

(30) Foreign Application Priority Data

Jul. 28, 2011 (JP) .................. 2011-165719

(51) Int. Cl.
*C30B 25/08* (2006.01)
*C30B 25/10* (2006.01)
(Continued)

(52) U.S. Cl.
CPC ............. *C30B 25/08* (2013.01); *C30B 25/10* (2013.01); *C30B 25/12* (2013.01); *C30B 25/14* (2013.01); *C30B 29/36* (2013.01)

(58) Field of Classification Search
CPC ....... C30B 25/00; C30B 25/02; C30B 25/025; C30B 25/08; C30B 25/10; C30B 25/12;
(Continued)

(56) References Cited

U.S. PATENT DOCUMENTS 7,449,065 B1 * 11/2008 Powell .................. C30B 11/14
117/108
2002/0056412 A1  5/2002 Hara et al.
(Continued)

FOREIGN PATENT DOCUMENTS

CN  1224084 A   7/1999
CN  1544713 A  11/2004
(Continued)

OTHER PUBLICATIONS

International Search Report of the International Searching Authority mailed Sep. 11, 2012 for the corresponding international application No. PCT/JP2012/004699 (with English translation).
(Continued)

*Primary Examiner* — Kenneth A Bratland, Jr.
(74) *Attorney, Agent, or Firm* — Posz Law Group, PLC

(57) ABSTRACT

A silicon carbide single crystal manufacturing apparatus includes a vacuum chamber, a pedestal on which a seed crystal is disposed, an inlet of source gas, a reaction chamber extending from a bottom surface of the vacuum chamber toward the pedestal, a first heating device disposed around an outer periphery of the reaction chamber, a second heating device disposed around an outer periphery of the pedestal, and an outlet disposed outside the first and second heating devices in the vacuum chamber. After the source gas supplied from the reaction chamber is supplied toward the pedestal, the source gas is let flow outward in a radial direction of the silicon carbide single crystal between the reaction chamber and the silicon carbide single crystal and is discharged through the outlet.

7 Claims, 4 Drawing Sheets

(51) Int. Cl.
*C30B 25/14* (2006.01)
*C30B 29/36* (2006.01)
*C30B 25/12* (2006.01)

(58) Field of Classification Search
CPC ....... C30B 25/14; C30B 25/16; C30B 25/165; C30B 29/00; C30B 29/10; C30B 29/36; C23C 16/22; C23C 16/30; C23C 16/32; C23C 16/325; C23C 16/44; C23C 16/4401; C23C 16/45519; Y10T 117/00; Y10T 117/10; Y10T 117/1004; Y10T 117/1008; Y10T 117/1016
USPC ................. 117/84, 88, 94, 98–99, 102, 107, 117/200–202, 204, 937, 951
See application file for complete search history.

(56) References Cited

U.S. PATENT DOCUMENTS

| 2004/0194694 | A1  | 10/2004 | Sugiyama et al. |
| 2005/0000406 | A1  | 1/2005  | Janzen et al. |
| 2008/0022923 | A1* | 1/2008  | Kordina ............ C23C 16/45519 117/84 |
| 2009/0107394 | A1  | 4/2009  | Kitou et al. |
| 2010/0307417 | A1  | 12/2010 | Kojima et al. |
| 2011/0155048 | A1* | 6/2011  | Kojima ................... C30B 23/00 117/84 |
| 2011/0155051 | A1* | 6/2011  | Hara ..................... C30B 23/063 117/109 |

FOREIGN PATENT DOCUMENTS

| CN | 101805927 A | 8/2010 |
| JP | H11-268990 A | 10/1999 |
| JP | 2002-362998 A | 12/2002 |
| JP | 2003-2795 A | 1/2003 |
| JP | 3419144 B2 | 4/2003 |
| JP | 2003-306398 A | 10/2003 |
| JP | 3922074 B2 | 3/2007 |
| JP | 2008-214146 A | 9/2008 |

OTHER PUBLICATIONS

Written Opinion of the International Searching Authority mailed Sep. 11, 2012 for the corresponding international application No. PCT/JP2012/004699 (with English translation).
Extended European Search Report dated Dec. 3, 2014 issued in corresponding EP patent application No. 12817305.1.
Office Action issued Sep. 21, 2015 in the corresponding CN application No. 201280037766.6 (with English translation).

* cited by examiner

SILICON CARBIDE SINGLE CRYSTAL MANUFACTURING APPARATUS

CROSS REFERENCE TO RELATED APPLICATIONS

This application is a U.S. national stage application of PCT/JP2012/004699 filed on Jul. 24, 2012, and claims priority to, and incorporates by reference, JP Patent Application No. 2011-165719 filed on Jul. 28, 2011.

TECHNICAL FIELD

The present disclosure relates to a silicon carbide (hereafter, referred to as SiC) single crystal manufacturing apparatus.

BACKGROUND ART

Conventionally, as a SiC single crystal manufacturing apparatus, a manufacturing apparatus having a structure described in the patent document 1 has been suggested. In the SiC single crystal manufacturing apparatus, a source gas inlet is provided below a seed crystal so as to introduce source gas from below the seed crystal. In addition, a gas outlet is provided above the seed crystal so as to discharge the rest of the source gas supplied to the seed crystal and carrier gas from above the seed crystal. Accordingly, new source gas is continuously supplied to the seed crystal to grow a SiC single crystal. In addition, in the SiC single crystal manufacturing apparatus, at surroundings of a pedestal on which the seed crystal is disposed, an inside diameter of a crucible is larger than the other portion so as to increase an opening size of the outlet. Furthermore, a plurality of holes is formed in the pedestal and the crucible and purge gas is introduced from the holes. Accordingly, during growth of the SiC single crystal, clogging of the outlet due to attachment of SiC polycrystalline to the surroundings of the pedestal on which the seed crystal is disposed can be restricted, and the SiC single crystal can grow for a long time.

However, in a case where gas is discharged from the outlet above the seed crystal through a side surface of the seed crystal, as the SiC single crystal manufacturing apparatus described in the patent document 1, even when the inside diameter of the crucible is increased, an opening width of the discharge path is small, and it is difficult to stably prevent clogging. This problem can be restricted when the inside diameter of the crucible is further increased. However, when the inside diameter of the crucible is increased, a distance from an inner wall of the crucible to the SiC single crystal is increased. Thus, it is difficult to keep a high temperature of a growth surface of the SiC single crystal and to control a shape of the SiC single crystal based on heat of the crucible and radiant heat. In other words, in the SiC single crystal manufacturing apparatus having the structure described in the patent document 1, there is a trade-off relationship between restriction of clogging of the discharge path and keeping a high temperature of the growth surface of the SiC single crystal and controlling the shape of the SiC single crystal. Thus, it is difficult to further restrict clogging of the discharge path and to keep a high temperature of the growth surface of the SiC single crystal and to control the shape of the SiC single crystal more easily.

PRIOR ART DOCUMENTS

Patent Document

[Patent Document 1] US 2008/022923 A1

SUMMARY OF INVENTION

In view of the foregoing points, it is an object of the present disclosure to provide a SIC single crystal manufacturing apparatus that can restrict clogging of a discharge path, can easily keep a high temperature of a growth surface of a SiC single crystal and can easily control a shape of the SiC single crystal.

An SiC single crystal manufacturing apparatus according to an aspect of the present disclosure includes a vacuum chamber, a pedestal, an inlet, a reaction chamber, a first heating device, a second heating device, and an outlet. The pedestal is disposed in the vacuum chamber. On the pedestal, a seed crystal made of a SiC single crystal substrate is disposed. The inlet is disposed on a bottom surface of the vacuum chamber and introduces source gas of SiC from below the seed crystal. The reaction chamber extends from the bottom surface of the vacuum chamber toward the pedestal in the vacuum chamber. The reaction chamber includes a cylindrical member having a hollow portion through which the source gas passes. The reaction chamber decomposes the source gas by heating and supplies the decomposed source gas toward the seed crystal. The first heating device is disposed around an outer periphery of the reaction chamber and heats the reaction chamber. The second heating device is disposed around an outer periphery of the pedestal and keeps a high temperature of a growth surface of a SiC single crystal grown on a surface of the seed crystal. The outlet is disposed outside the first and second heating devices in the vacuum chamber and discharges unreacted gas in the source gas.

After the source gas supplied from the reaction chamber is supplied toward the pedestal, the source gas is let flow outward in a radial direction of the SiC single crystal between the reaction chamber and the SiC single crystal, is let flow outside the first and second heating devices in the vacuum chamber, and is discharged through the outlet.

The above-described SiC single crystal manufacturing apparatus can restrict clogging of a discharge path, can easily keep a high temperature of the growth surface of the SiC single crystal, and can easily control a shape of the SiC single crystal.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION (First Embodiment)

Figure 1:
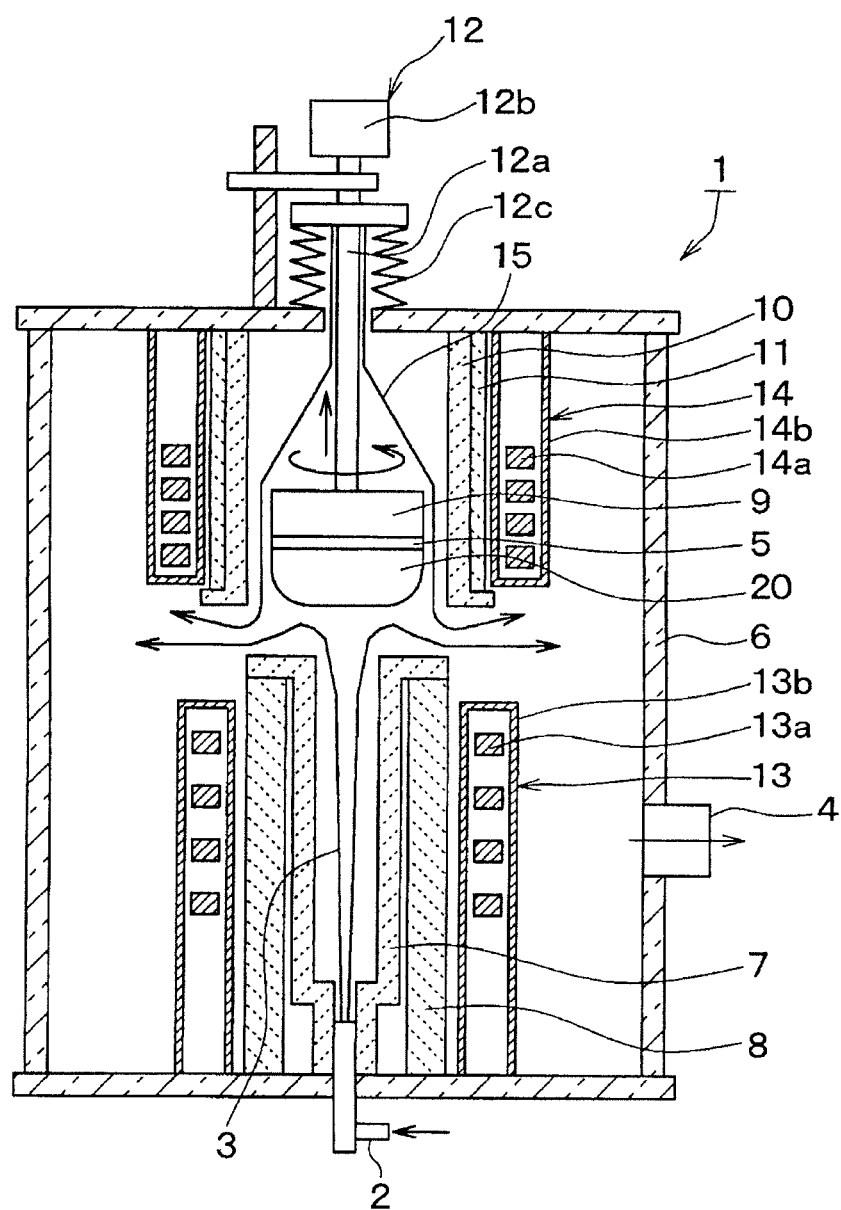
FIG. 1 is a cross-sectional view of a SiC single crystal manufacturing apparatus according to a first embodiment of the present disclosure.

FIG. 1 shows a cross-sectional view of a SiC single crystal manufacturing apparatus 1 according to the present embodiment. A structure of the SiC single crystal manufacturing apparatus 1 will be described with reference to this figure.

In the SiC single crystal manufacturing apparatus 1 shown in FIG. 1, source gas 3 of SiC including Si and C (e.g., mixed gas of silane system gas, such as silane, as gas including silicon and hydrocarbon system gas, such as propane, as gas including carbon) is supplied with carrier gas through an inlet 2 disposed at a bottom and is discharged through an outlet 4 so that a SiC single crystal 20 is grown on a seed crystal 5 made of a SIC single crystal substrate disposed in the SiC single crystal manufacturing apparatus 1.

The SiC single crystal manufacturing apparatus 1 includes a vacuum chamber 6, a reaction chamber 7, a heat insulator 8, a pedestal 9, a guide 10, an outer peripheral heat insulator 11, a pull-up mechanism 12, and first and second heating devices 13, 14.

The vacuum chamber 6 is made of, for example, silica glass. The vacuum chamber 6 has a hollow cylindrical shape and can introduce and discharge carrier gas and the source gas 3. In addition, other components of the SiC single crystal manufacturing apparatus 1 are housed in an internal space of the vacuum chamber 6. The vacuum chamber 6 can reduce pressure of the internal space by vacuuming. The inlet 2 of the source gas 3 is disposed at the bottom of the vacuum chamber 6. The outlet 4 of the source gas 3 is disposed at a portion of the vacuum chamber 6 outside the first and second heating devices 13, 14, for example, a center portion or a lower portion of a sidewall of the vacuum chamber 6.

The reaction chamber 7 extends from the inlet 2 toward the pedestal 9. The reaction chamber 7 is made of, for example, graphite or graphite whose surface is coated with high melting-point metallic carbide, such as TaC (tantalum carbide). Compared with the pedestal 9, the reaction chamber 7 is disposed on upstream side of a flow path of the source gas 3. Before introducing the source gas 3, which is supplied from the inlet 2, to the seed crystal 5, the reaction chamber 7 decomposes the source gas 3 by heating while removing particles included in the source gas 3. The source gas 3 decomposed by heating in the reaction chamber 7 is supplied to the seed crystal 5, and carbon atoms and silicon atoms become super saturation state on a surface of the seed crystal 5. Accordingly, the SiC single crystal 20 is deposited on the surface of the seed crystal 5.

Specifically, the reaction chamber 7 includes a cylindrical member having a hollow portion. For example, the reaction chamber 7 includes a hollow cylindrical member. The reaction chamber 7 is disposed coaxially with the vacuum chamber 6. In the present embodiment, the reaction chamber 7 is connected with the inlet 2 such that an inside diameter of an end portion of the reaction chamber 7 adjacent to the inlet 2 is decreased so as to correspond to the inlet 2, and the source gas 3 is introduced to the surface of the seed crystal 5 through the hollow portion of the reaction chamber 7. The reaction chamber 7 has a flange shape (L-shape) in which an outside diameter of an end portion adjacent to the pedestal 9 is increased. Accordingly, the reaction chamber 7 can easily introduce discharge gas radially outward. In addition, the reaction chamber 7 can prevent the heat insulator 8 from coming into contact with the source gas 3.

The heat insulator 8 restricts heat diffusion in a radially outward direction of the reaction chamber 7. The heat insulator 8 has a cylindrical shape and is disposed coaxially with the vacuum chamber 6 and the reaction chamber 7 so as to surround the outer periphery of the reaction chamber 7. The heat insulator 8 is made of, for example, graphite or graphite whose surface is coated with high melting-point metallic carbide, such as TaC (tantalum carbide).

The pedestal 9 is disposed coaxially with a central axis of the reaction chamber 7. The pedestal 9 is made of, for example, graphite or graphite whose surface is coated with high melting-point metallic carbide, such as TaC (tantalum carbide). The seed crystal 5 is attached to and held by the pedestal 9 and the SiC single crystal 20 is grown on the surface of the seed crystal 5. The pedestal 9 has a shape corresponding to a shape of the seed crystal 5 to be grown. For example, the pedestal 9 has a disc shape. The seed crystal 5 is connected to the pull-up mechanism 12 on a surface opposite from the surface on which the seed crystal 5 is disposed.

A size of the pedestal 9, for example, an outside diameter of the pedestal 9 in a case where the pedestal 9 has the disc shape is equal to or greater than an inside diameter of the hollow portion of the reaction chamber 7 adjacent to the pedestal 9. The size of the pedestal 9 is, for example, 6 inches. Thus, the source gas 3 supplied through the hollow portion of the reaction chamber 7 collides against a center portion of the pedestal 9, that is, a center portion of the seed crystal 5 and is let flow outward in the radial direction of the seed crystal 5.

The guide 10 is disposed coaxially with the central axis of the vacuum chamber 6 so as to surround the pedestal 9. The guide 10 extends downward from an upper surface of the vacuum chamber 6. The guide 10 is also made of, for example, graphite or graphite whose surface is coated with high melting-point metallic carbide, such as TaC (tantalum carbide). When the pedestal 9 and the seed crystal 5 are pulled up in accordance with growth of the SiC single crystal 20, the guide 10 keeps an outer peripheral surface of the SiC single crystal 20 at a predetermined temperature. In the present embodiment, an inside diameter of the guide 10 is greater than the outside diameter of the pedestal 9 by a predetermined size. Thus, the SiC single crystal 20 can be pulled up while keeping the predetermined distance from the guide 10.

An end portion of the guide 10 adjacent to the reaction chamber 7 has a flange shape (L-shape) and can restrict the outer peripheral heat insulator 11 from coming into contact with the source gas 3. The end portion of the guide 10 adjacent to the reaction chamber 7 and the end portion of the reaction chamber 7 adjacent to the guide 10 have a predetermined distance clearance therebetween. The L-shaped end portions of the reaction chamber 7 and the guide 10 form a gas outlet. The source gas 3 and the like are let flow outside the first and second heating devices 13, 14 through the clearance and are discharged through the outlet 4.

The peripheral heat insulator 11 surrounds the outer periphery of the guide 10 so as to restrict heat diffusion from the guide 10 radially outward. The peripheral heat insulator 11 is also made of, for example, graphite or graphite whose surface is coated with high melting-point metallic carbide, such as TaC (tantalum carbide).

The pull-up mechanism 12 includes a pipe member 12a, a body 12b, and a bellows 12c. An end of the pipe member 12a is connected to the surface of the pedestal 9 opposite from the surface on which the seed crystal 5 is attached, and the other end of the pipe member 12a is connected to the body 12b of the pull-up mechanism 12. The pipe member 12a is made of, for example, SUS. The body 12b introduces purge gas (dilution gas) 15 from between the pipe member 12a and the bellows 12c while rotating and pulling up the pipe member 12a. The bellows 12c form an introducing space of the purge gas 15. The bellows 12c surrounds the pipe member 12a and is capable of expanding and contracting with pull up of the pipe member 12a.

By the above-described structure, the body 12b can introduce the purge gas 15 from between the pipe member 12a and the bellows 12c while rotating and pulling up the pipe member 12a. Accordingly, the pedestal 9, the seed crystal 5, and the SiC single crystal 20 can be rotated and pulled up with the pipe member 12a, the growth surface of the SiC single crystal 20 can have a desired temperature distribution, and a temperature of the growth surface can be controlled to a temperature appropriate for growth in accordance with the growth of the SiC single crystal 20. Furthermore, because the purge gas 15 is introduced through the clearance between the pedestal 9 and the seed crystal 5 and the guide 10, the source gas 3 can be restricted from entering the clearance. The purge gas 15 is gas for diluting the source gas 3. For example, inactive gas such as Ar and He or etching gas such as $H_2$ and HCl is used as the purge gas 15.

The first and second heating devices 13, 14 include introducing heating coils and heaters. The first heating device 13 surrounds the outer peripheries of the reaction chamber 7 and the heat insulator 8. The second heating device 14 surrounds the outer periphery of the pedestal 9. In the present embodiment, the second heating device 14 surrounds outer peripheries of the guide 10 and the outer peripheral heat insulator 11. The first and second heating devices 13, 14 can control temperature independently from each other. Temperature control of heated portions by the first and second heating devices 13, 14 can be performed independently and finely. In other words, the first heating device 13 can heat the reaction chamber 7 to a temperature at which the reaction chamber 7 can decompose the source gas 3 by heating. The second heating device 14 heats the guide 10 and the growth surface of the SiC single crystal 20. Accordingly, the temperature distribution of the growth surface of the SiC single crystal 20 can be controlled to a state appropriate for the growth of the SiC single crystal 20.

For example, in the present embodiment, the first and second heating devices 13, 14 include induction heating coils 13a, 14a, and coil protecting tubes 13b, 14b are disposed so as to surround the induction heating coils 13a, 14a. Accordingly, corrosion of the induction heating coils 13a, 14a is prevented. The coil protecting tubes 13b, 14b are made of, for example, silica tubes. As a corrosion resistance structure, except for covering the induction heating coils 13a, 14a with the coil protecting tubes 13b, 14b, the induction heating coils 13a, 14a may be treated with a corrosion resistance coating (SiC coat or $SiO_2$ coat).

The SiC single crystal manufacturing apparatus 1 is configured as described above. Subsequently, a manufacturing method of the SiC single crystal 20 using the SiC single crystal manufacturing apparatus 1 according to the present embodiment will be described.

After the seed crystal 5 is attached to the pedestal 9, the first and second heating devices 13, 14 are controlled so as to provide a desired temperature distribution. Specifically, the first heating device 13 is controlled to induction-heat the reaction chamber 7 to 2500° C., and the second heating device 14 is controlled to induction-heat the guide 10 to 2200° C. By controlling the temperature as described above, the source gas 3, which is introduced later, is decomposed by heating in the reaction chamber 7, and the source gas 3 can be recrystallized on the surface of the seed crystal 5.

Moreover, in a state where the vacuum chamber 6 is kept at a desired pressure, the source gas 3 is introduced through the inlet 2 with carrier gas of inert gas, such as Ar and He, or etching gas, such as $H_2$ and HCl, as necessary. For example, silane is introduced at 1 liter/minute, propane is introduced at 0.33 liter/minute, and hydrogen is introduced at 15 liter/minute. Accordingly, the source gas 3 is let flow on a path shown by the arrows in the figure, the source gas 3 is supplied to the surface of the seed crystal 5 in a state where the source gas 3 is decomposed by heating in the heated reaction chamber 7, and the SiC single crystal 20 is grown on the surface of the seed crystal 5.

At this time, the pull-up mechanism 12 introduces the purge gas 15 including the inert gas, such as Ar and He, or the etching gas, such as $H_2$ and HCl, through between the pipe member 12a and the bellows 12c. Accordingly, as shown by arrows in the figure, the purge gas 15 is introduced from surroundings of the pedestal 9. Then, unreacted gas in the source gas 3 that does not reach a super saturation state and does not contribute to the growth of the SiC single crystal 20 is let flow to a space outside the first and second heating devices 13, 14 in the vacuums chamber 6 through the clearance between the reaction chamber 7 and the guide 10 while being diluted by the purge gas 15. Accordingly, components of SiC included in the unreacted gas become particles outside portions of the vacuum chamber 6, such as the reaction chamber 7 and the guide 10, forming a crucible for growing the SiC single crystal 20, and are deposited and removed at the bottom of the vacuum chamber 6.

As described above, in the present embodiment, between the reaction chamber 7 and the SiC single crystal 20, the unreacted gas in the source gas 3 is discharged outward in the radial direction of the SiC single crystal 20. Specifically, the clearance is provided between the reaction chamber 7 and the guide 10, and the unreacted gas in the source gas 3 is discharged outside through the clearance. In other words, the unreacted gas is not discharged above the vacuum chamber 6 through the outer periphery of the pedestal 9 and the unreacted gas is discharged outward in the radial direction of the SiC single crystal 20 below the pedestal 9. Thus, compared with a case where the unreacted gas passes through the outer periphery of the pedestal 9, a width of the discharge path can be increased, and clogging of the discharge path can be further restricted. In a case where the unreacted gas is let flow outward in the radial direction of the SiC single crystal 20, the cross-sectional area of the discharge path gradually increases. Thus, the unreacted gas can be further diluted, and clogging of the discharge path can be further restricted.

In addition, because it is not necessary to take into account clogging of discharge path of the outer periphery of the pedestal 9, the high temperature of the growth surface of the SiC single crystal 20 can be easily kept and the shape of the SiC single crystal 20 can be easily controlled by controlling the second heating device 14. Specifically, it is not necessary to set the distance between the guide 10 and the pedestal 9 in view of clogging of the discharge path. Thus, clogging of the discharge path can be further restricted, the high temperature of the growth surface of the SiC single crystal 20 can be easily kept, and the shape of the SiC single crystal 20 can be easily controlled.

(Second Embodiment)

A second embodiment of the present disclosure will be described. In the present embodiment, the purge gas 15 is also introduced from a side adjacent to the reaction chamber 7 with respect to the first embodiment, and the other portions are similar to the first embodiment. Thus, only a portion different from the first embodiment will be described.

Figure 2:
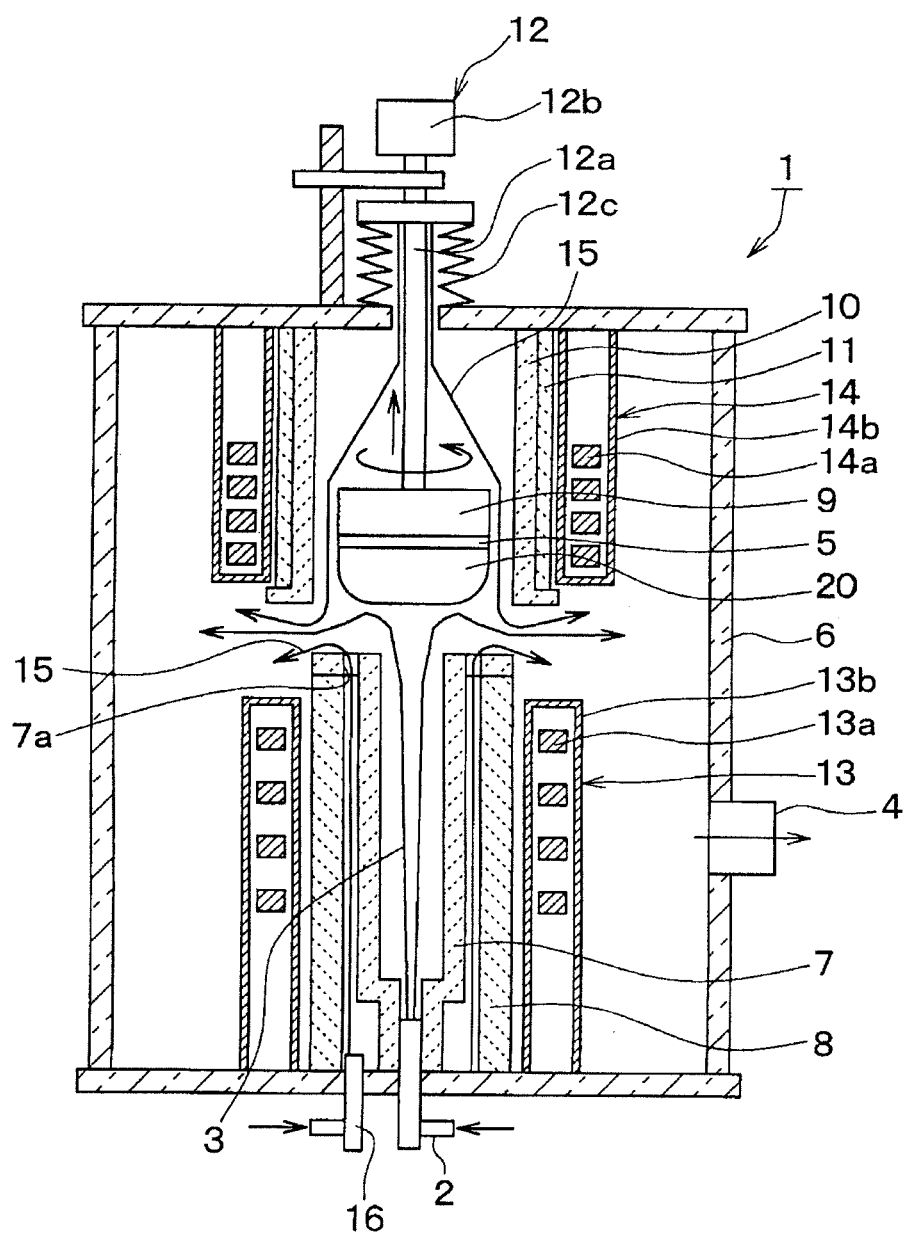
FIG. 2 is a cross-sectional view of a SiC single crystal manufacturing apparatus according to a second embodiment of the present disclosure.

FIG. 2 is a cross-sectional view of a SiC single crystal manufacturing apparatus 1 according to the present embodiment. As shown in the figure, in the present embodiment, through holes 7a are provided at the end portion of the reaction chamber 7 adjacent to the guide 10, in particular, at the portion having the flange shape, the clearance is provided between the reaction chamber 7 and the heat insulator 8, and a inlet 16 of the purge gas 15 is provided on the bottom surface of the vacuum chamber 6. The through holes 7a are provided at regular interval in a circumferential direction centering on the central axis of the reaction chamber 7.

In the above-described configuration, when the purge gas 15 is introduced from the inlet 16, the purge gas 15 is supplied from the clearance between the reaction chamber 7 and the heat insulator 8 to the clearance between the pedestal and the reaction chamber 7 through the through holes 7a. Accordingly, the purge gas 15 can be supplied from the side adjacent to the reaction chamber 7. Thus, the unreacted gas in the source gas 3 that does not reach a super saturation state and does not contribute to the growth of the SiC single crystal 20 can be diluted by the purge gas 15, and clogging of the discharge path can be further restricted.

(Third Embodiment)

A third embodiment of the present disclosure will be described. In the present embodiment, a protection structure of the vacuum chamber 6 is added with respect to the first embodiment, and the other portions are similar to the first embodiment. Thus, a portion different from the first embodiment will be described.

Figure 3:
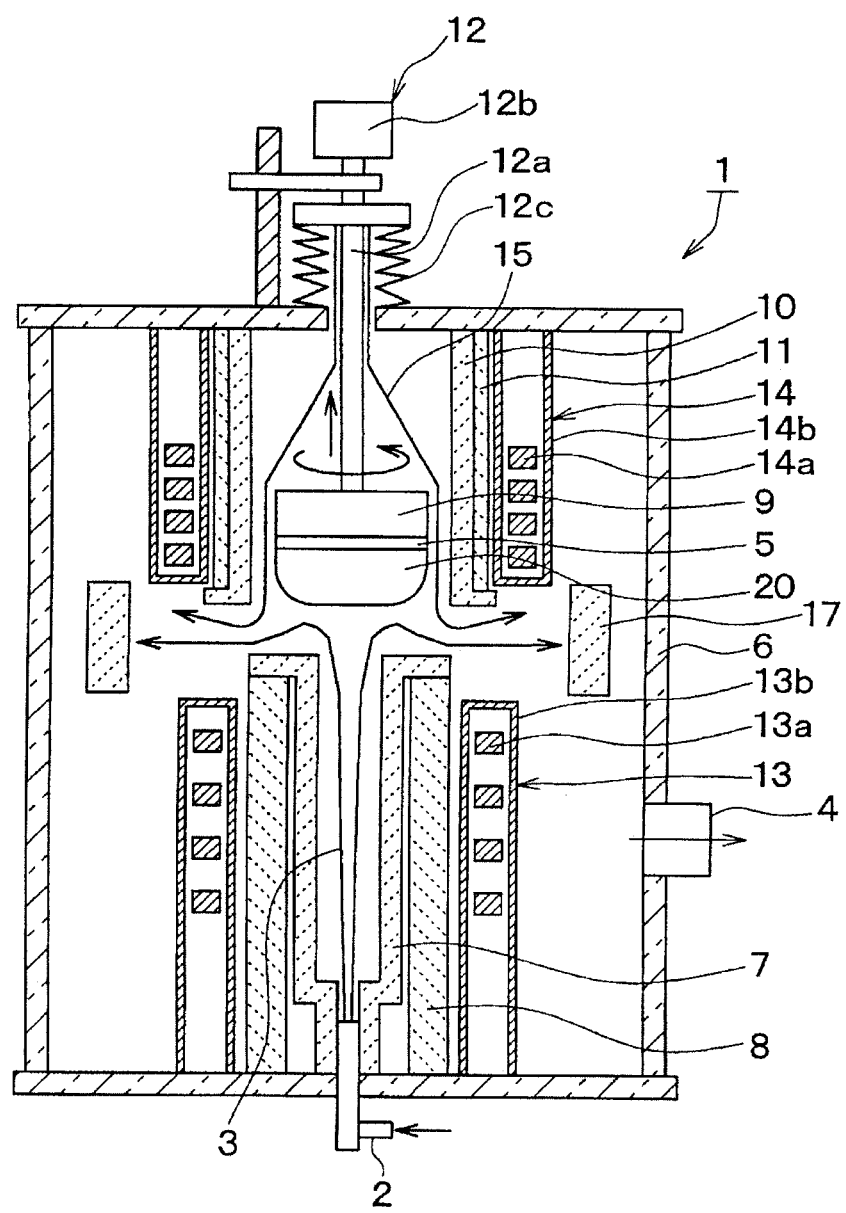
FIG. 3 is a cross-sectional view of a SiC single crystal manufacturing apparatus according to a third embodiment of the present disclosure.

FIG. 3 is a cross-sectional view of the SiC single crystal manufacturing apparatus 1 according to the present embodiment. As shown in this figure, in the present embodiment, a shielding plate 17 is disposed so as to surround a periphery of the clearance between the reaction chamber 7 and the guide 10. The shielding plate 17 is made of, for example, graphite or graphite whose surface is coated with high melting-point metallic carbide, such as TaC (tantalum carbide). The shielding plate 17 is disposed at a position at a predetermined distance from the end portion of the guide 10 so as not to interrupt flow of the source gas 3 and the purge gas 15. Although it is not shown in the figure, the shielding plate 17 is held by a plurality of holding bars extending in a direction toward the bottom surface of the vacuum chamber 6.

By providing the shielding plate 17, the clearance between the reaction chamber 7 and the guide 10 is shielded from radiation heat from a high temperature portion, and the vacuum chamber 6 can be prevented from being subjected to the heat radiation directly. Thus, the vacuum chamber 6 can be protected against heat. In addition, when the shielding plate 17 is disposed, heat can be restricted from escaping from a growth space of the SiC single crystal 20, that is, from the clearance between the reaction chamber 7 and the guide 10. Thus, heat loss can be reduced.

(Fourth Embodiment)

A fourth embodiment of the present disclosure will be described. In the present embodiment, a structure of the guide 10 is changed with respect to the first embodiment, and the other portions are similar to the first embodiment. Thus, only a portion different from the first embodiment will be described.

Figure 4:
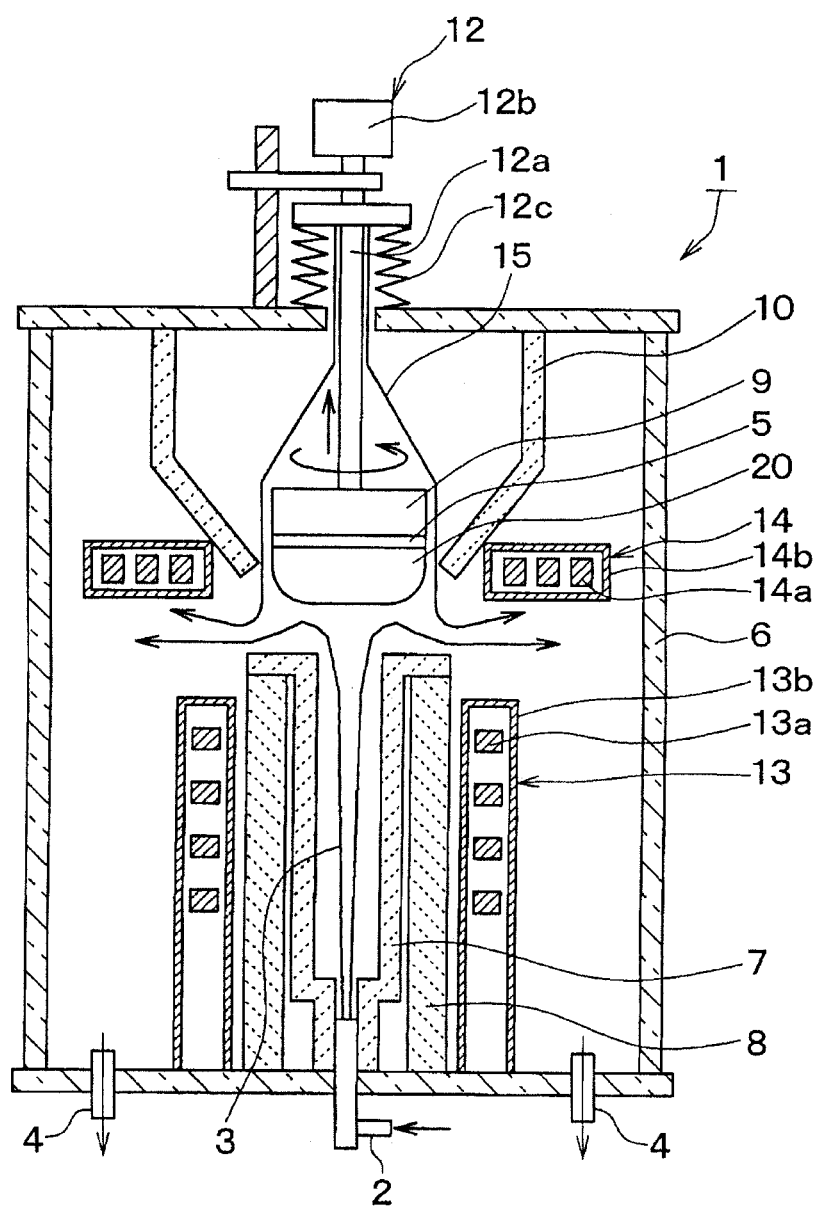
FIG. 4 is a cross-sectional view of a SIC single crystal manufacturing apparatus according to a fourth embodiment of the present disclosure.

FIG. 4 is a cross-sectional view of a SIC single crystal manufacturing apparatus 1 according to the present embodiment. As shown in this figure, in the present embodiment, an inside diameter of the guide 10 gradually increases in the pull-up direction of the pedestal 9. In a case where the inside diameter of the guide 10 increases, even when the SiC single crystal 20 expands in the radial direction, the SiC single crystal 20 can be prevented from coming into contact with the inner wall of the guide 10.

In this case, at the upper portion in the pull-up direction of the pedestal 9, the distance from the inner wall of the guide 10 to the pedestal 9 increases. However, if the high temperature of the growth surface of the SiC single crystal 20 can be kept, the shape of the SiC single crystal 20 can be easily controlled. Thus, there is no problem even when the distance from the inner wall of the guide 10 to the pedestal 9 increases. In addition, in the present embodiment, the induction heating coil 14a of the second heating device 14 is concentrated at the end portion of the guide 10. By the above-described structure, the high temperature of the growth surface of the SiC single crystal 20 can be kept.

(Other Embodiments)

In each of the above-described embodiments, an example of the configuration of the SiC single crystal manufacturing apparatus 1 has been described. However, the configuration of the SiC single crystal manufacturing apparatus 1 can be changed as needed.

For example, the structure in which the pedestal 9 is pulled up by the pull-up mechanism 12 so that the SiC single crystal 20 can be grown longer has been described. However, the pull-up mechanism is not necessarily provided. Similarly, although the guide 10 corresponding to the pull up of the pedestal 9 has been described as a guide surrounding the pedestal 9, a guide having a structure surrounding at least the pedestal 9 may be used. Although clogging of the discharge path can be further restricted by introduction of the purge gas 15, introduction of the purge gas 15 is not necessary. Thus, the pull-up mechanism 12 may function as a mere rotating pull-up mechanism. Instead of the pull-up mechanism 12, a mere rotating mechanism that does not pull up may be used. Although the pedestal 9 is rotated to make the temperature distribution more uniform, the rotating mechanism may be omitted from the pull-up mechanism 12 and the pull-up mechanism 12 may function as a pull-up gas introducing mechanism. Furthermore, gas introduction may be omitted and the pull-up mechanism 12 may function as a mere pull-up mechanism.

Although the reaction chamber 7 and the guide 10 has been described as separate members, a hole functioning as a gas path may be formed in a member in which the reaction chamber 7 and the guide 10 are integrated below the growth surface of the SiC single crystal 20, and the unreacted gas of the source gas 3 and the purge gas 15 may be discharged outward in the radial direction of the SiC single crystal 20 through the hole. In this case, when a plurality of holes is provided at regular interval in the circumferential direction, the cross-sectional area of the discharge path can be increased, clogging of the discharge path can be further restricted. Also in this case, the shielding plate 17 described in the third embodiment may be disposed. In the vacuum chamber 6, at least the shielding plate 17 should be disposed at a position covering the portion between the reaction chamber 7 and the SiC single crystal 20 through which the source gas 3 is discharged. In each of the above-described embodiment, a case where the inert gas or the etching gas is used as the purge gas has been described. However, gas that becomes an impurity dopant of the SIC single crystal to be grown, for example, nitrogen ($N_2$) gas may also be used as purge gas.

The invention claimed is:

1. A silicon carbide single crystal manufacturing apparatus comprising:
a vacuum chamber;
a pedestal on which a seed crystal made of a silicon carbide single crystal substrate is disposed, the pedestal disposed in the vacuum chamber;
an inlet disposed on a bottom surface of the vacuum chamber and introducing source gas of silicon carbide from below the seed crystal;
a reaction chamber extending from the bottom surface of the vacuum chamber toward the pedestal in the vacuum chamber, the reaction chamber including a cylindrical member having a hollow portion through which the source gas passes, the reaction chamber decomposing the source gas by heating and supplying the decomposed source gas toward the seed crystal;
a first heating device disposed around an outer periphery of the reaction chamber and heating the reaction chamber;
a second heating device disposed around an outer periphery of the pedestal and keeping a high temperature of a growth surface of a silicon carbide single crystal grown on a surface of the seed crystal;
an outlet disposed outside the first and second heating devices in the vacuum chamber and discharging unreacted gas in the source gas; and
a guide surrounding the pedestal, disposed at a predetermined distance apart from the pedestal, and disposed at a predetermined distance apart from an upper end of the reaction chamber adjacent to the pedestal, wherein:
the second heating device is disposed around an outer periphery of the guide,
an end portion of the reaction chamber adjacent to the pedestal has a flange shape,
an end portion of the guide adjacent to the reaction chamber has a flange shape,
the upper end of the reaction chamber is located below the growth surface of the silicon carbide single crystal with a clearance, and
after the source gas supplied from the reaction chamber is supplied toward the pedestal, the source gas is let flow outward in a radial direction of the silicon carbide single crystal through the clearance between the upper end of the reaction chamber and the growth surface of the silicon carbide single crystal and a clearance between the reaction chamber and the guide, is let flow outside the first and second heating devices in the vacuum chamber, and is discharged through the outlet.

2. The silicon carbide single crystal manufacturing apparatus according to claim 1,
wherein purge gas is introduced through a clearance between the pedestal and the guide, and is let flow outside the first and second heating devices in the reaction chamber through the clearance between the reaction chamber and the guide while diluting the source gas.

3. The silicon carbide single crystal manufacturing apparatus according to claim 1, further comprising
a pull-up mechanism pulling up the pedestal,
wherein an inside diameter of the guide increases upward.

4. The silicon carbide single crystal manufacturing apparatus according to claim 1,
wherein the reaction chamber and the pedestal are coaxially disposed, and
wherein an outside diameter of the pedestal is equal to or greater than an inside diameter of an end of the reaction chamber adjacent to the pedestal.

5. The silicon carbide single crystal manufacturing apparatus according to claim 1,
wherein the first and second heating devices include induction heating coils and corrosion-resistant structures covering the induction heating coils.

6. The silicon carbide single crystal manufacturing apparatus according to claim 1,
wherein purge gas is introduced from the bottom surface of the vacuum chamber and is let flow outside the first and second heating devices in the vacuum chamber while diluting the source gas.

7. The silicon carbide single crystal manufacturing apparatus according to claim 1, further comprising
a shielding plate disposed in the vacuum chamber, the shielding plate covering a position corresponding to a portion between the reaction chamber and the silicon carbide single crystal through which the source gas is discharged.

* * * * *